(12) United States Patent
Pipia et al.

(10) Patent No.: US 11,587,866 B2
(45) Date of Patent: Feb. 21, 2023

(54) INTEGRATED ELECTRONIC DEVICE WITH A REDISTRIBUTION REGION AND A HIGH RESILIENCE TO MECHANICAL STRESSES AND METHOD FOR ITS PREPARATION

(71) Applicant: STMICROELECTRONICS S.r.l., Agrate Brianza (IT)

(72) Inventors: Francesco Maria Pipia, Milan (IT); Ivan Venegoni, Bareggio (IT); Annamaria Votta, Osnago (IT); Francesca Milanesi, Milan (IT); Samuele Sciarrillo, Usmate Velate (IT); Paolo Colpani, Agrate Brianza (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 69 days.

(21) Appl. No.: 17/000,165

(22) Filed: Aug. 21, 2020

(65) Prior Publication Data

US 2020/0388569 A1 Dec. 10, 2020

Related U.S. Application Data

(62) Division of application No. 16/044,186, filed on Jul. 24, 2018, now Pat. No. 10,790,226.

(30) Foreign Application Priority Data

Jul. 28, 2017 (IT) .......................... 102017000087318

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76802* (2013.01); *H01L 21/76843* (2013.01);
(Continued)

(58) Field of Classification Search
CPC ......... H01L 23/53238; H01L 23/53252; H01L 24/03; H01L 21/76885; H01L 21/768;
(Continued)

(56) References Cited

U.S. PATENT DOCUMENTS

| | | |
|---|---|---|
| 5,223,454 A | 6/1993 | Uda et al. |
| 5,937,320 A | 8/1999 | Andricacos et al. |

(Continued)

FOREIGN PATENT DOCUMENTS

| | | |
|---|---|---|
| CN | 102709263 A | 10/2012 |
| CN | 103165481 A | 6/2013 |

(Continued)

*Primary Examiner* — Alexander O Williams
(74) *Attorney, Agent, or Firm* — Seed IP Law Group LLP

(57) ABSTRACT

A method of manufacturing an integrated electronic device including a semiconductor body and a passivation structure including a frontal dielectric layer bounded by a frontal surface. A hole is formed extending into the frontal surface and through the frontal dielectric layer. A conductive region is formed in the hole. A barrier layer is formed in the hole and extends into the hole. A first coating layer covers a top and sides of a redistribution region of the conductive region and a second coating layer covers is formed covering the first coating layer. A capillary opening is formed extending into the first and second coating layers to the barrier layer. A cavity is formed between the redistribution region and the frontal surface and is bounded on one side by the first coating layer and on the other by the barrier structure by passing an aqueous solution through the capillary opening.

20 Claims, 8 Drawing Sheets

(51) Int. Cl.
  *H01L 23/532* (2006.01)
  *H01L 23/528* (2006.01)
  *H01L 23/525* (2006.01)
(52) U.S. Cl.
  CPC .. *H01L 21/76852* (2013.01); *H01L 21/76885* (2013.01); *H01L 23/5283* (2013.01); *H01L 23/53238* (2013.01); *H01L 23/53252* (2013.01); *H01L 23/525* (2013.01); *H01L 2224/023* (2013.01)
(58) Field of Classification Search
  CPC ............... H01L 21/76843; H01L 24/05; H01L 23/5226; H01L 23/5283; H01L 21/76852; H01L 2224/0518; H01L 2224/05166; H01L 2224/05664; H01L 2224/05186; H01L 2221/1078; H01L 2924/181; H01L 2224/05644; H01L 2224/48247; H01L 2224/05155; H01L 2224/0557; H01L 2924/00014; H01L 2224/05144; H01L 2224/023; H01L 2224/05569; H01L 2224/451; H01L 2224/05164; H01L 23/525; H01L 2224/05184; H01L 2224/48091; H01L 2224/05147; H01L 2924/00012; H01L 2924/0001; H01L 2224/45099; H01L 2224/05181; H01L 2924/04953; H01L 2224/05138; H01L 2924/01015; H01L 2924/013; H01L 2924/01028; H01L 2924/01074; H01L 2924/04941; H01L 2924/01022; H01L 2924/0101; H01L 2924/01042; H01L 2924/0107; H01L 2224/0516
  USPC .......................................................... 257/774
  See application file for complete search history.

(56) References Cited

U.S. PATENT DOCUMENTS

| | | | |
|---|---|---|---|
| 5,946,590 | A | 8/1999 | Satoh |
| 6,228,759 | B1 | 5/2001 | Wang et al. |
| 6,528,412 | B1 | 3/2003 | Wang et al. |
| 6,593,220 | B1 | 7/2003 | Yu et al. |
| 6,756,294 | B1 | 6/2004 | Chen et al. |
| 7,863,739 | B2 | 1/2011 | Lee et al. |
| 7,947,978 | B2 | 5/2011 | Lin et al. |
| 8,298,930 | B2 | 10/2012 | Arvin et al. |
| 8,476,762 | B2 | 7/2013 | Daubenspeck et al. |
| 8,530,344 | B1 | 9/2013 | Shih et al. |
| 8,809,951 | B2 | 8/2014 | Lin et al. |
| 8,884,418 | B2 | 11/2014 | Camacho et al. |
| 9,224,686 | B1 | 12/2015 | Chen et al. |
| 10,790,226 | B2 * | 9/2020 | Pipia ................. H01L 21/76852 |
| 2001/0040290 | A1 | 11/2001 | Sakurai et al. |
| 2004/0166661 | A1 | 8/2004 | Lei |
| 2005/0116340 | A1 | 6/2005 | Shindo |
| 2005/0215045 | A1 | 9/2005 | Rinne et al. |
| 2005/0258539 | A1 | 11/2005 | Minda |
| 2007/0023919 | A1 | 2/2007 | Lin et al. |
| 2007/0205520 | A1 | 9/2007 | Chou et al. |
| 2007/0246133 | A1 | 10/2007 | Helneder et al. |
| 2008/0122078 | A1 | 5/2008 | He et al. |
| 2008/0258299 | A1 | 10/2008 | Kang et al. |
| 2009/0102032 | A1 | 4/2009 | Schneegans et al. |
| 2009/0152100 | A1 | 6/2009 | Dalal et al. |
| 2010/0109159 | A1 | 5/2010 | Ho et al. |
| 2010/0155949 | A1 | 6/2010 | Jain |
| 2010/0171219 | A1 | 7/2010 | Moreau et al. |
| 2011/0049705 | A1 | 3/2011 | Liu et al. |
| 2011/0101521 | A1 | 5/2011 | Hwang et al. |
| 2011/0101527 | A1 | 5/2011 | Cheng et al. |
| 2011/0147932 | A1 | 6/2011 | Trezza et al. |
| 2012/0007231 | A1 | 1/2012 | Chang |
| 2012/0012997 | A1 | 1/2012 | Shen et al. |
| 2012/0064712 | A1 | 3/2012 | Lei et al. |
| 2012/0091577 | A1 | 4/2012 | Hwang et al. |
| 2012/0129335 | A1 | 5/2012 | Ikumo et al. |
| 2012/0175774 | A1 | 7/2012 | West et al. |
| 2013/0113097 | A1 | 5/2013 | Yu et al. |
| 2013/0134582 | A1 | 5/2013 | Yu et al. |
| 2014/0001615 | A1 | 1/2014 | Otremba et al. |
| 2014/0299990 | A1 | 10/2014 | Kageyama et al. |
| 2014/0327133 | A1 | 11/2014 | Lin |
| 2014/0327134 | A1 | 11/2014 | Lin |
| 2014/0361431 | A1 | 12/2014 | Matsumoto et al. |
| 2015/0108589 | A1 | 4/2015 | Cheng et al. |
| 2016/0276237 | A1 | 9/2016 | Lin et al. |
| 2016/0300804 | A1 | 10/2016 | Omori |
| 2016/0379946 | A1 | 12/2016 | Maekawa et al. |
| 2017/0011982 | A1 | 1/2017 | Theuss et al. |
| 2017/0053872 | A1 | 2/2017 | Lee et al. |
| 2017/0098627 | A1 | 4/2017 | Das et al. |
| 2017/0221840 | A1 | 8/2017 | Paleari et al. |
| 2019/0035728 | A1 | 1/2019 | Venegoni et al. |

FOREIGN PATENT DOCUMENTS

| | | |
|---|---|---|
| CN | 206293434 U | 6/2017 |
| DE | 10 2008 048 424 A1 | 5/2009 |
| JP | 63-249346 A | 10/1988 |
| JP | 2008-28112 A | 2/2008 |
| JP | 2009-231681 A | 10/2009 |
| JP | 2013-165099 A1 | 8/2013 |
| WO | 98/52224 A1 | 11/1998 |

* cited by examiner

INTEGRATED ELECTRONIC DEVICE WITH A REDISTRIBUTION REGION AND A HIGH RESILIENCE TO MECHANICAL STRESSES AND METHOD FOR ITS PREPARATION

BACKGROUND

Technical Field

The present disclosure relates to an integrated electronic device, which includes a redistribution region and has a high resilience to mechanical stresses, and to the related method of fabrication.

Description of the Related Art

As is known, in the field of technologies for fabricating semiconductor circuits, reference is generally made to the redistribution layer (RDL) in order to indicate an additional metal layer of an integrated circuit ('chip') formed within a die, which allows the input/output pads (I/O) formed within the same die to be rendered electrically accessible. In other words, the redistribution layer is a metal layer connected to the I/O pads, to which the wires which allow the 'wire bonding' may, for example, be connected in different positions with respect to the positions in which the pads are disposed. The redistribution layer thus allows, for example, the processes of electrical connection between chips to be simplified.

One example of use of the redistribution layer is shown schematically in FIG. 1A, where an integrated electronic device 10 is shown.

In detail, the integrated electronic device 10 is formed within a die 4, which includes a body of semiconductor material 6, which is bounded by an upper surface $S_{up}$ and, although not shown, may include regions with different types and levels of doping. Furthermore, the integrated electronic device 10 comprises a frontal structure 8, which extends over the upper surface $S_{up}$.

The frontal structure 8 comprises a plurality of dielectric layers, disposed in a stack; for example, in FIG. 1 a first, a second, a third, a fourth, a fifth, a sixth, a seventh and an eighth dielectric layer are shown, which are at decreasing distances relative to the upper surface $S_{up}$, are respectively indicated with 11, 12, 14, 16, 17, 18, 19 and 20 and form a passivation structure 21 through which metal interconnects are defined.

The frontal structure 8 furthermore comprises a number of first metallizations M1, to which reference is henceforth made as proximal metallizations M1, as well as a number of second and third metallizations M2, M3, to which reference is henceforth respectively made as intermediate metallizations M2 and as distal metallizations M3. The intermediate metallizations M2 extend, at a distance, between the proximal metallizations M1 and the distal metallizations M3.

The distal metallizations M3 extend through the third dielectric layer 14, hence they open out onto the fourth dielectric layer 16.

The intermediate metallizations M2 extend through the fifth dielectric layer 17, hence they open out onto the fourth dielectric layer 16 and onto the sixth dielectric layer 18.

The proximal metallizations M1 extend through the seventh dielectric layer 19, hence they open out onto the sixth dielectric layer 18 and onto the eighth dielectric layer 20.

The frontal structure 8 also comprises a number of contact regions CR formed by metal material, which extend through the eighth dielectric layer 20 in such a manner as to open out onto the semiconductor body 6, with which they are in direct contact. Furthermore, the contact regions CR are in contact with corresponding first metallizations M1, disposed on top of these.

The frontal structure 8 furthermore comprises a plurality of first vias V1, to which reference is henceforth made as proximal vias V1, as well as a number of second and third vias V2, V3, to which reference is henceforth respectively made as intermediate vias V2 and as distal vias V3. Each proximal via V1 electrically connects a proximal metallization M1 and a corresponding intermediate metallization M2; each intermediate via V2 electrically connects an intermediate metallization M2 and a corresponding distal metallization M3.

Each distal via V3 extends into a corresponding hole T, which passes through the first and the second dielectric layer 11, 12. In this regard, the first dielectric layer 11 is typically formed from silicon nitride (SiN) and the first dielectric layer 11 is bounded on top by a surface $S_{front}$, to which reference is henceforth made as frontal surface $S_{front}$. The second dielectric layer 12 is formed, for example, from silicon oxide. The sum of the thicknesses of the dielectric layers 11 and 12 may for example be greater than 1 μm.

The bottom of the hole T is thus bounded by a corresponding distal metallization M3, whereas the sidewall of the hole T is bounded by the first and by the second dielectric layers 11 and 12. Furthermore, the bottom and the sidewalls of the hole T are covered, in direct contact, by a first patterned barrier layer 22, which may for example have a thickness greater than 100 nm and may be formed from titanium (Ti), or tantalum (Ta), or by one of their alloys (for example TiN, TiW, TaNTa). The first patterned barrier layer 22 furthermore extends in part over the top of the frontal surface $S_{front}$, in direct contact with the first dielectric layer 11.

The first patterned barrier layer 22 is, in turn, covered by a further layer 24, to which reference is henceforth also made as patterned seed layer 24.

The patterned seed layer 24 is typically formed from copper and this may also for example have a thickness greater than 10 nm. The patterned seed layer 24 thus extends inside of the hole T, in such a manner as to cover the portions of the first patterned barrier layer 22 which cover the bottom and the sidewalls of the hole T. Furthermore, the patterned seed layer 24 extends over the portions of the first patterned barrier layer 22 which extend over the first dielectric layer 11.

The frontal structure 8 furthermore comprises a conductive region 25, to which reference is henceforth made as redistribution layer 25.

The redistribution layer 25 is formed from the same conductive material as that forming the distal vias V3. The redistribution layer 25 is thus typically formed from copper, is patterned and overlies the distal vias V3, with which it forms a single monolithic region. Furthermore, the redistribution layer 25 may for example have a thickness greater than 1 μm.

The redistribution layer 25 also extends over the top of the portions of the patterned seed layer 24 disposed on top of the frontal surface $S_{front}$. In more detail, the patterned seed layer 24 also forms the aforementioned monolithic region, together with the redistribution layer 25 and the distal vias V3.

The frontal structure 8 furthermore comprises a first coating layer 30, which covers the top and the sides of the redistribution layer 25, as far as making contact with portions of the first dielectric layer 11. The first coating layer 30 is typically formed from nickel or from one of its alloys (for example NiP, NiPW, NiPMo).

In greater detail, with reference to FIG. 1B, the first coating layer 30 covers laterally the portions of the patterned seed layer 24 which extend over the frontal surface $S_{front}$ in a first contact area 60, as well as the portions of the first patterned barrier layer 22 which extend over the top of the frontal surface $S_{front}$ in a second contact area 61. As a consequence, lower portions of the first coating layer 30 make contact with portions of the first patterned barrier layer 22 which extend over the top of the frontal surface $S_{front}$, as well as overlying portions of the patterned seed layer 24.

The frontal structure 8 furthermore comprises a second coating layer 32, which is typically formed from a noble metal, such as for example gold, palladium or a combination of both (Pd/Au), and the combined thickness of the first and second coating layers 30, 32 may for example be greater than 1 µm. Typically, in the step of fabrication, the second coating layer 32 is formed without applying electric fields ("electroless" deposition technique).

In detail, the second coating layer 32 is deposited on top of the first coating layer 30, with which it is in direct contact. The second coating layer 32 thus surrounds the redistribution layer 25 on the top and sides.

In practice, the first and the second coating layers 30, 32 form a capping structure, which covers the redistribution layer 25.

For practical reasons, the first coating layer 30 is formed from a material (nickel) having a greater hardness compared with the material (copper) which forms the redistribution layer 25, the latter material having a higher conductivity. The first coating layer 30 provides rigidity to the frontal structure 8 during the bonding steps, so as to prevent the deformation of the redistribution layer 25. Furthermore, the first coating layer 30 serves as a barrier against the migration/electromigration of the material forming the redistribution layer 25.

As far as, on the other hand, the second coating layer 32 is concerned, this is formed by a noble metal and thus prevents the underlying metals from being subjected to oxidation or corrosion.

Compared with the first patterned barrier layer 22, this is metal and furthermore serves as a barrier against the migration to the first dielectric layer 11 of the material that forms the redistribution layer 25. Furthermore, the first patterned barrier layer 22 improves the adhesion between the patterned seed layer 24 and the underlying layers.

FIG. 2 illustrates schematically the method through which structures like that illustrated above are obtained. For simplicity, FIG. 2 shows only an upper portion of the integrated electronic device 10, given that the elements disposed underneath the fourth dielectric layer 16 are not shown.

Initially, as shown in FIG. 2A, the die 4 (not shown in FIG. 2A) is arranged and the vias, the metallizations and the passivation structure 21 are formed. Portions of the first and of the second dielectric layers 11, 12, are then selectively removed starting from the surface $S_{front}$, in such a manner as to form the hole T, so as to obtain the structure illustrated in FIG. 2A.

Subsequently, as shown in FIG. 2B, a first barrier layer 22', destined to form the first patterned barrier layer 22, and a seed layer 24', destined to form the patterned seed layer 24, are formed. The first barrier layer 22' extends over the frontal surface $S_{front}$ and covers the sidewall and the bottom of the hole T, while the seed layer 24' extends over the first barrier layer 22'.

The first barrier layer 22' and the seed layer 24' are respectively formed from the same materials as the first patterned barrier layer 22 and as the patterned seed layer 24. As previously stated, the first barrier layer 22' may be formed, again by way of example, from Ti, or Ta, or from one of their alloys (TiN, TiW, TaNTa). Furthermore, the first barrier layer 22' and the seed layer 24' may both have a thickness greater than 100 nm.

It is however known to create structures in which the barrier region is formed from more than one barrier layer to form a multilayer.

The presence of at least one further barrier layer allows the possibility of the occurrence of an undesirable migration of the material that forms the redistribution layer 25 to the passivation structure 21 to be reduced. In other words, the addition of further barrier layers allows the metal material forming the redistribution layer 25 and the patterned seed layer 24 to be better encapsulated, compared with the case in which only the first barrier layer 22 is present.

Subsequently, as shown in FIG. 2C, a resist mask 23 is formed on top of the seed layer 24', which defines a window W over the hole T. The formation of the resist mask 23 includes for example the formation on the seed layer 24' of a layer of resist and subsequently the patterning of this layer of resist by means of photolithography.

In greater detail, the window W is such that it exposes a portion of the seed layer 24' disposed inside of the hole T and portions of the seed layer 24' that laterally protrude from the hole T over the frontal surface $S_{front}$.

Subsequently, as shown in FIG. 2D, the redistribution layer 25 and the distal vias V3 are formed, which are monolithic with one another and are formed from the same material as the seed layer 24' (for example, copper). The redistribution layer 25 and the distal vias V3 are formed for example by means of electrochemical deposition (or ECD), with growth starting from the exposed portions of the seed layer 24'. Furthermore, the presence of the resist mask 23 allows the redistribution layer 25 to be patterned.

In more detail, the redistribution layer 25 and the distal vias V3 form a single monolithic region together with the seed layer 24', although, for the sake of clarity, the latter layer is shown as separate.

Subsequently, as shown in FIG. 2E, the resist mask 23 is removed.

Subsequently, as shown in FIG. 2F, two successive etches are carried out, for example of the wet type, with the aim of removing the exposed portions of the seed layer 24', together with the underlying portions (which become exposed) of the first barrier layer 22'. In this way, the residual portions of the first barrier layer 22' and of the seed layer 24' respectively form the first patterned barrier layer 22 and the patterned seed layer 24.

For practical purposes, the redistribution layer 25 and the portions of the patterned seed layer 24 disposed on top of the frontal layer $S_{front}$ form a single redistribution region. Similarly, the portion of the patterned seed layer 24 disposed inside of the hole T forms a kind of vertical conductive region together with the distal via V3.

Subsequently, as shown in FIG. 2G, the first coating layer 30 is formed, which entirely covers the exposed portions of the redistribution layer 25, of the patterned seed layer 24 and of the barrier layer 22. As previously stated, the first coating layer 30 may be formed from nickel, or else, again by way of example, from a nickel-phosphorous (NiP), nickel-phosphorous-tungsten (NiPW) or nickel-phosphorous-molybdenum (NiPMo) alloy.

For example, the first coating layer 30 is formed by means of electroless deposition on the exposed metal surfaces.

The subsequent formation of the second coating layer 32 thus leads to what is shown in FIG. 2G. For example, the second coating layer 32 is formed by means of a deposition of the electroless type and selectively grows on the exposed surfaces of the first coating layer 30.

This having been said, because of the different mechanical characteristics of the materials that form the redistribution layer 25, the first dielectric layer 11 and the first and the second coating layers 30, 32, it is possible for the integrated electronic device 10 to be subjected to excessive mechanical stresses, which may compromise the operation. In particular, the stresses manifest themselves in the case in which the fabrication process includes the execution of steps with a high thermal budget. In particular, the potential application of a high thermal budget to the integrated electronic device 10, described in FIG. 1A, may comprise the generation of forces acting on the entire structure and which are not freely dispersed because of the intimate contact between the barrier layer 22 and the capping structure formed by the first and second coating layers 30 and 32.

BRIEF SUMMARY

An aim of the present disclosure is thus to provide an integrated electronic device designed to reduce the mechanical stresses undergone by a passivation layer by avoiding the contact between coating and barrier layers of the device.

In one embodiment an integrated electronic device includes a semiconductor body and a passivation structure over the semiconductor body. The passivation structure includes a frontal dielectric layer bounded by a frontal surface. A conductive region of a first metal material includes a via region extending into a hole passing through the frontal dielectric layer, and also includes an overlaid redistribution region extending over the frontal surface. The overlaid redistribution region has a top and at least one side. A barrier structure includes at least one first barrier region of a second metal material extending into the hole and surrounding the via region, and extends over the frontal surface. A first coating layer of a third metal material covers the top and the at least one side of the redistribution region. A second coating layer of a fourth metal material covers the first coating layer. The second coating layer includes a cavity extending between the redistribution region and the frontal surface with the cavity being bounded on one side by the first coating layer and on another side by the barrier structure.

BRIEF DESCRIPTION OF THE SEVERAL VIEWS OF THE DRAWINGS

For a better understanding of the disclosure, embodiments thereof are now described, purely by way of non-limiting example and with reference to the appended drawings, in which.

DETAILED DESCRIPTION

Figure 1A:
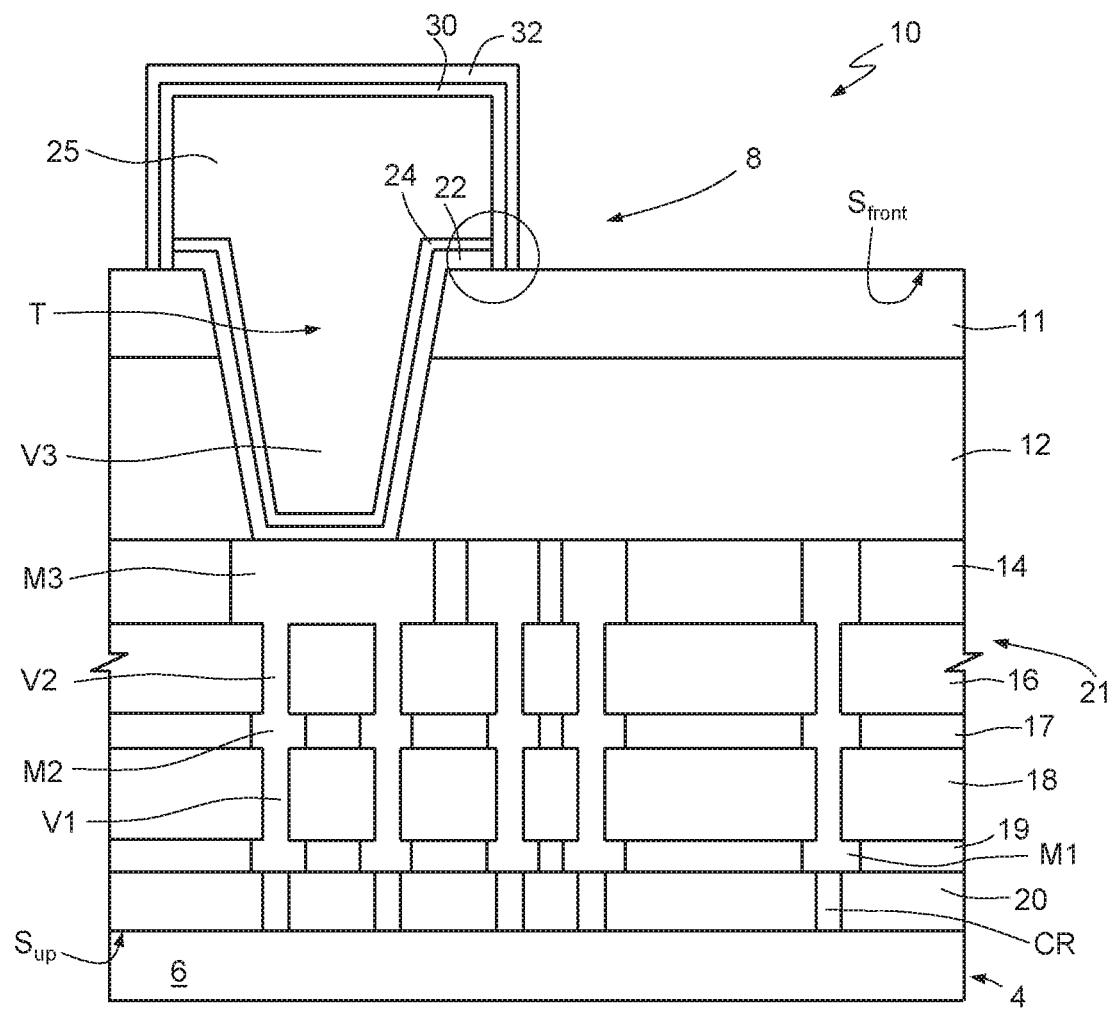
FIGS. 1A and 1B show schematically transverse cross sections (not to scale) of portions of an integrated electronic device.

The applicant has observed how the frontal structure 8 shown in FIG. 1A gives rise, in the presence of high temperatures, to mechanical forces which are not able to be freely dispersed because of the strong adhesion present between the capping structure formed by the first and second coating layers 30, 32 and the barrier layer 22. The present integrated electronic device thus arises from the idea of creating gaps between the capping structure and the barrier layer 22.

Figure 1B:
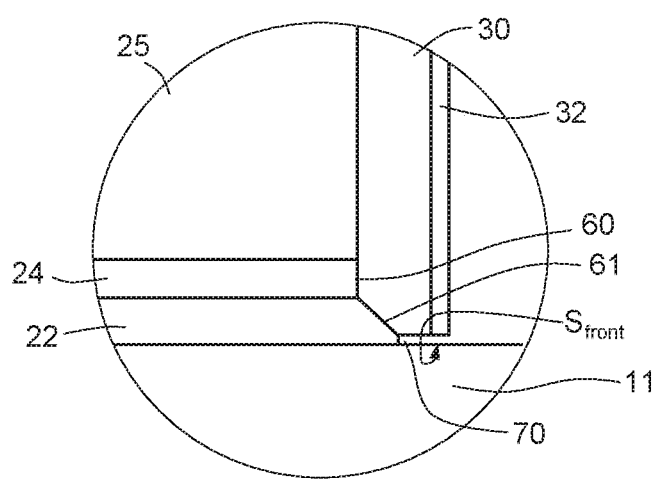

In particular, as shown in FIG. 1B, the inventors have highlighted the presence of capillary openings 70 between the capping structure formed by the first and second coating layers 30, 32 and the first dielectric layer 11. These capillary openings 70 are spontaneously generated during the step of growing the first and the second coating layer 30, 32 because of a poor adhesion between the materials constituting these layers and the materials constituting the first dielectric layer 11. In more detail, as exemplified schematically in FIG. 1B, the capillary openings 70 are formed between the frontal surface $S_{front}$ of the first dielectric layer 11 and the lower portion of the capping structure formed by the first and second coating layers 30, 32 and are internally bounded by the barrier layer 22 so as to form a fluidic communication between the outside of the frontal structure 8 and the barrier layer 22.

The presence of these capillary openings 70 allows an integrated electronic device to be fabricated as described hereinbelow.

In the following, the present integrated electronic device is described, without any loss of generality, with reference to the differences compared with what is shown in FIG. 1. Elements already present in the integrated electronic device 10 shown in FIG. 1 will be indicated with the same reference symbols, unless specified otherwise.

Figure 3A:
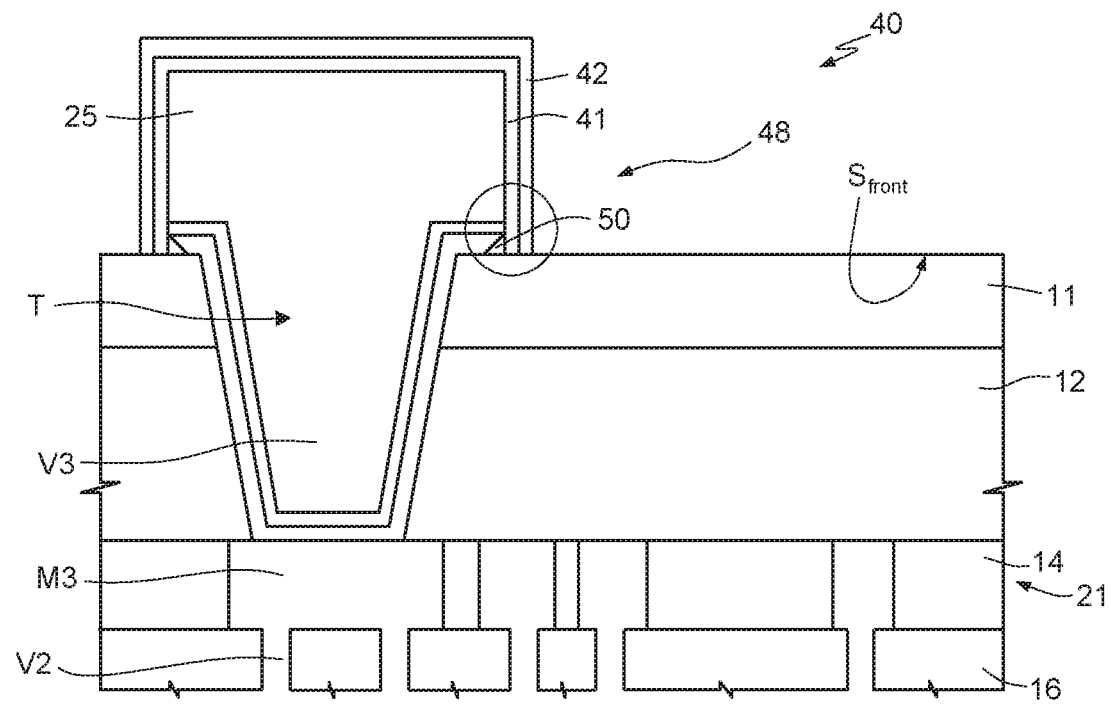
FIGS. 3A and 3B show schematically transverse cross sections (not to scale) of portions of an embodiment of the present integrated electronic device.

One embodiment of the present integrated electronic device is shown in FIG. 3A, where it is indicated with 40.

In particular, FIG. 3A shows only an upper portion of the integrated electronic device 40, given that the elements disposed underneath the fourth dielectric layer 16 are not shown.

This having been said, the first coating layer, here indicated with 41, covers the top and the sides of the redistribution layer 25 and is disposed on top of the first dielectric layer 11 and separated from this by means of the capillary openings 70 which typically have a transverse cross section of less than 10 nm.

Furthermore, the first coating layer 41 is physically separated from the first patterned barrier layer 22, given that, between the first patterned barrier layer 22 and the first coating layer 41, a cavity 50 is present that extends below the patterned seed layer 24 as far as the first dielectric layer 11.

Figure 3B:
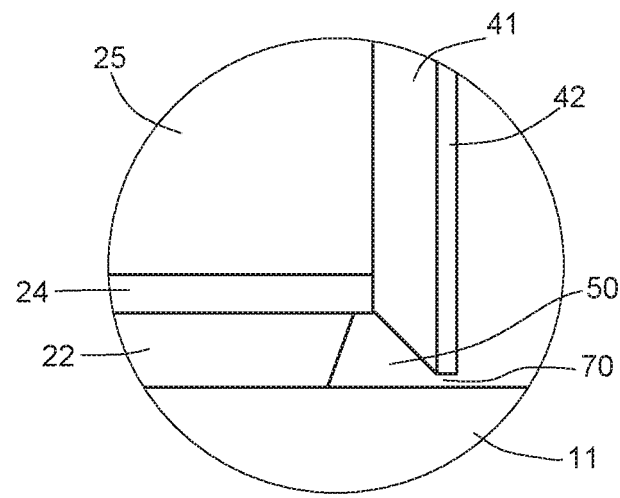

In greater detail, the cavity 50 is bounded at its base by the first dielectric layer 11, at the top by the patterned seed layer 24 and laterally on one side by the first patterned barrier layer 22 and on the other by the first coating layer 41 (FIG. 3B).

The second coating layer, here indicated with 42, entirely covers the first coating layer 41 and this is also disposed on top of the first dielectric layer 11 and separated from this by means of the capillary openings 70 which typically have a transverse cross section of less than 10 nm.

Therefore, in the frontal structure of the integrated electronic device 40, indicated with 48, the cavity 50 is present that thus reduces the intrinsic mechanical stress that the first coating layer 41 exerts on the passivation structure 21.

Similarly, the integrated electronic device 40 is lacking points at which the first patterned barrier layer 22 and the first coating layer 41 come into contact; these points represent points at which the structure formed by the redistribution layer 25 and by the first and second coating layers 41, 42 exerts the maximum mechanical stress during the processes at high temperature.

The embodiment shown in FIG. 3A may be obtained by implementing the following fabrication process.

Initially, an integrated electronic device as illustrated with reference to FIGS. 2A to 2G is fabricated.

Figure 2A:
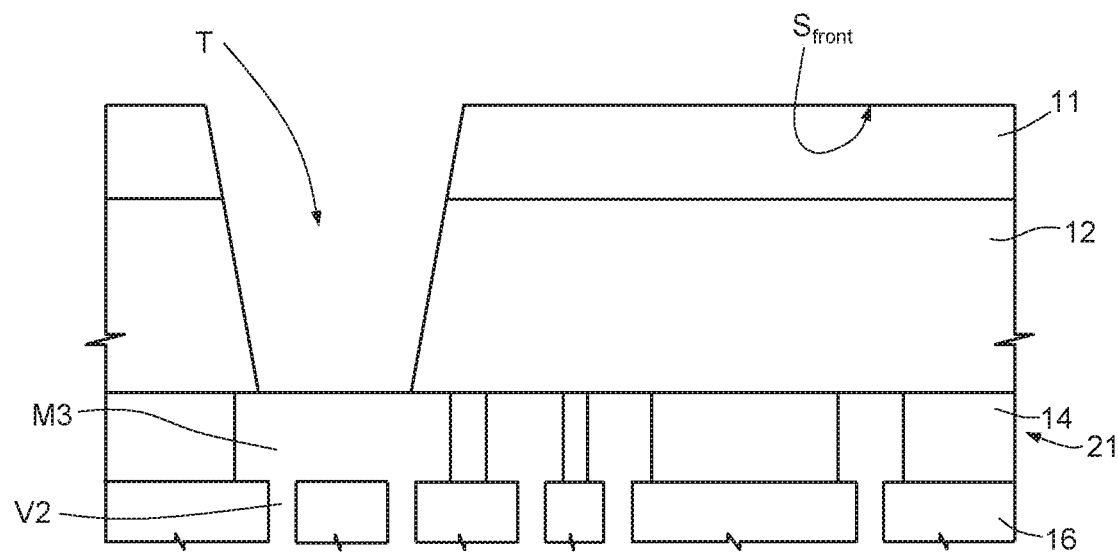
FIGS. 2A-2G show schematically transverse cross sections (not to scale) of portions of the integrated electronic device shown in FIG. 1, during successive steps of a fabrication process.
Figure 2B:
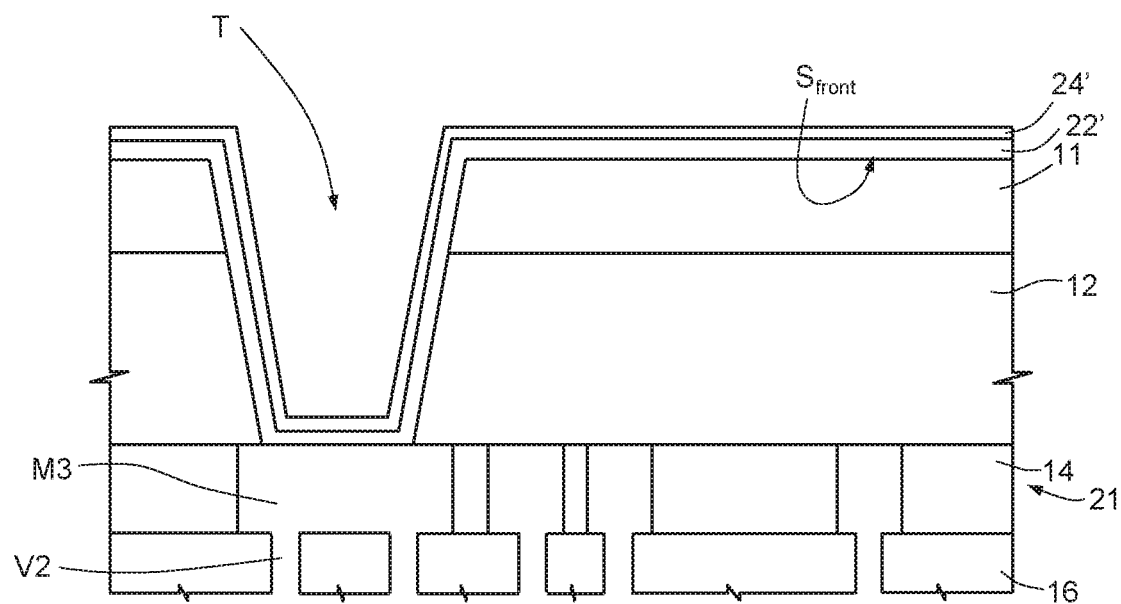
Figure 2C:
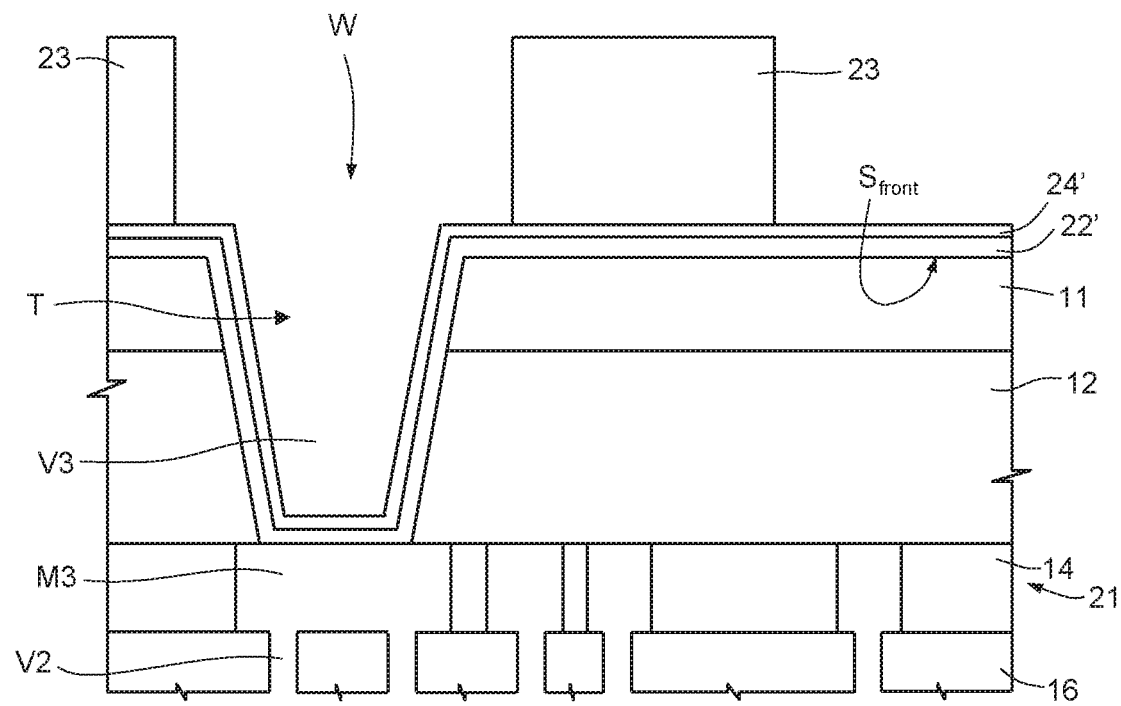
Figure 2D:
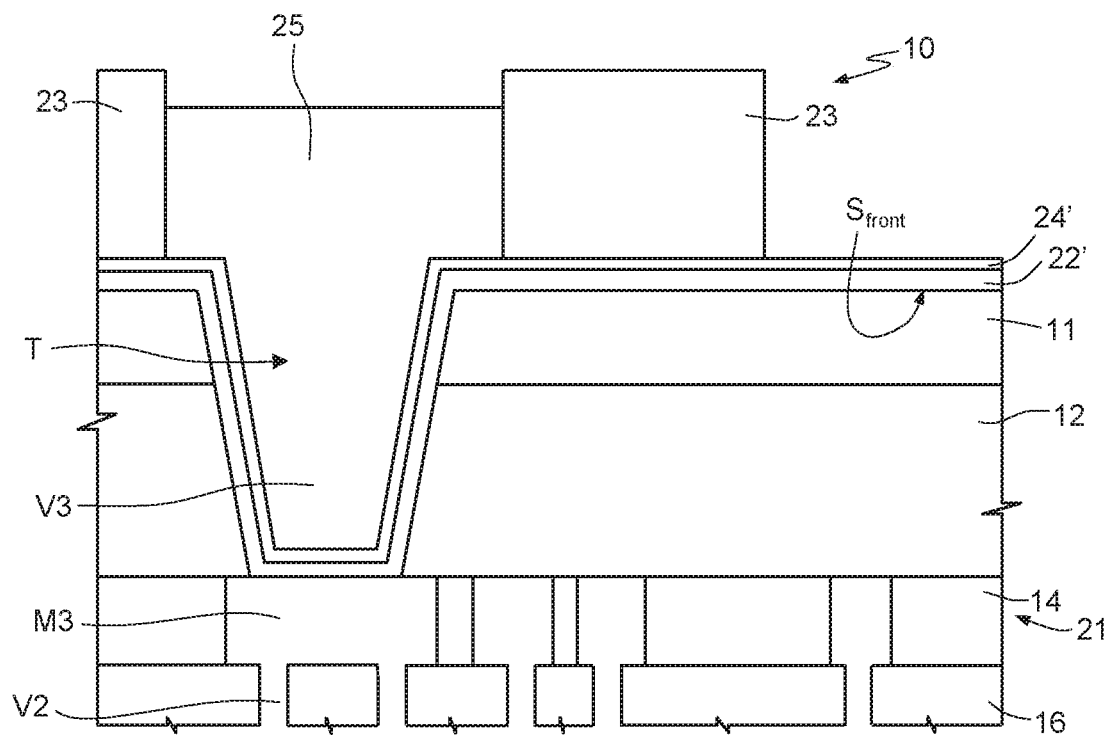
Figure 2E:
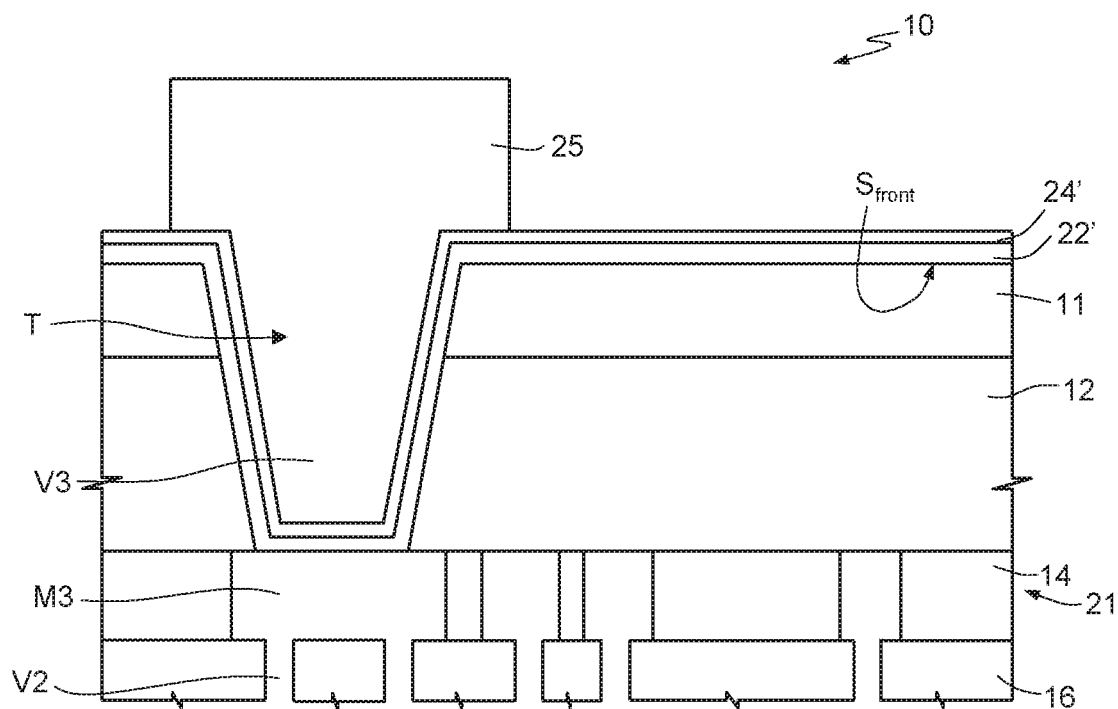
Figure 2F:
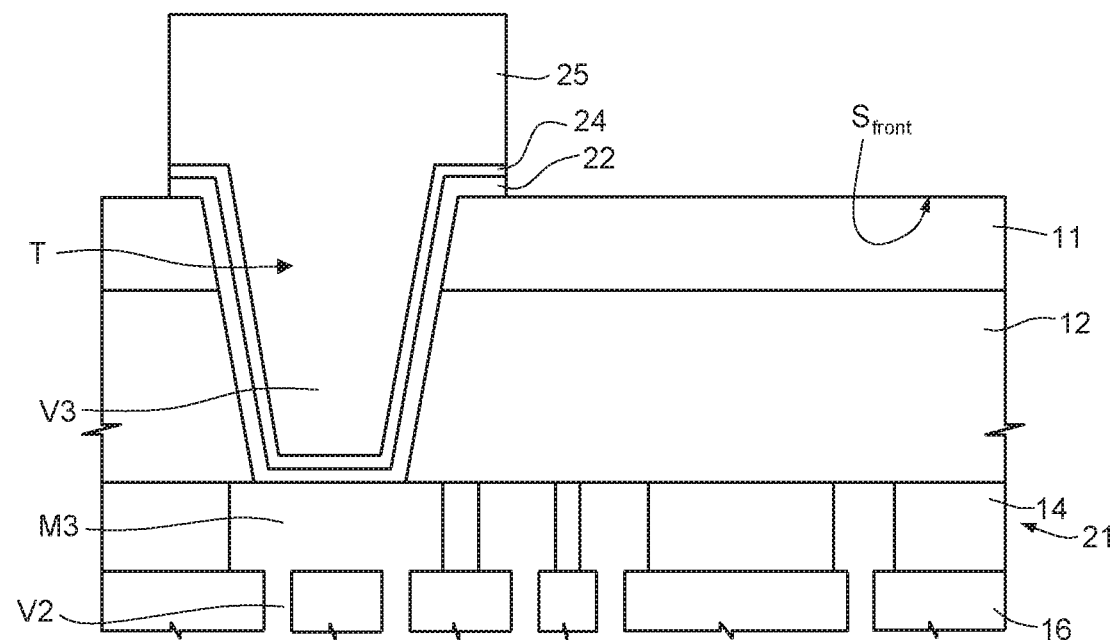
Figure 2G:
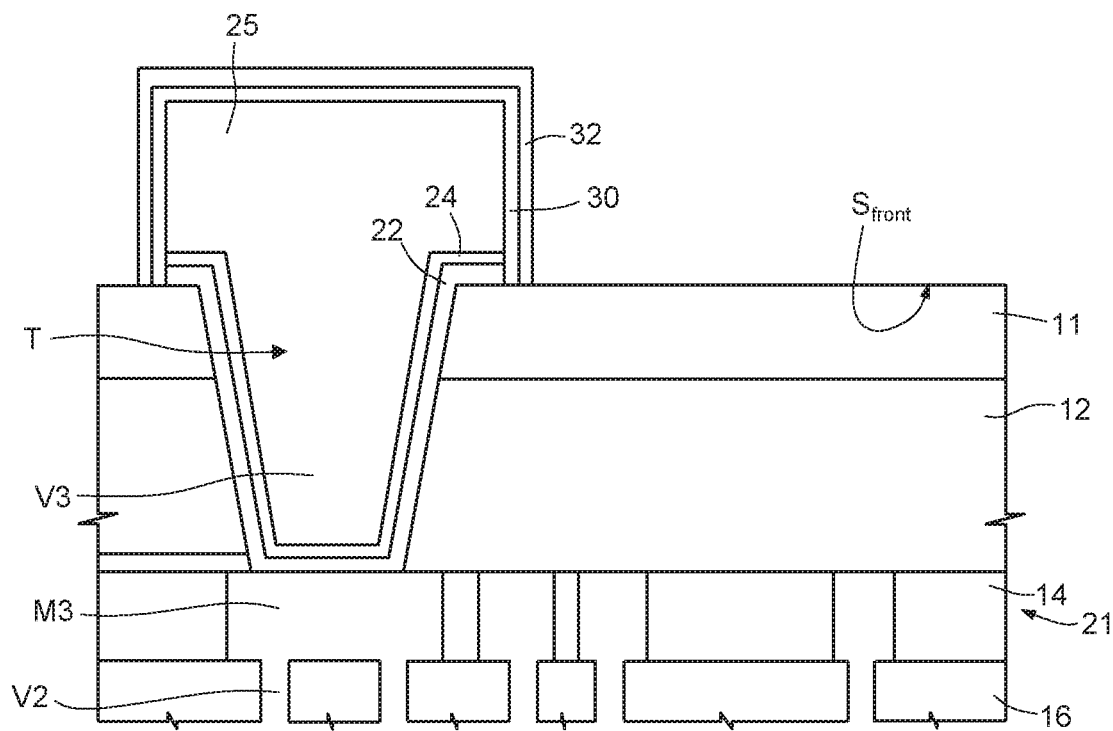
Figure 4A:
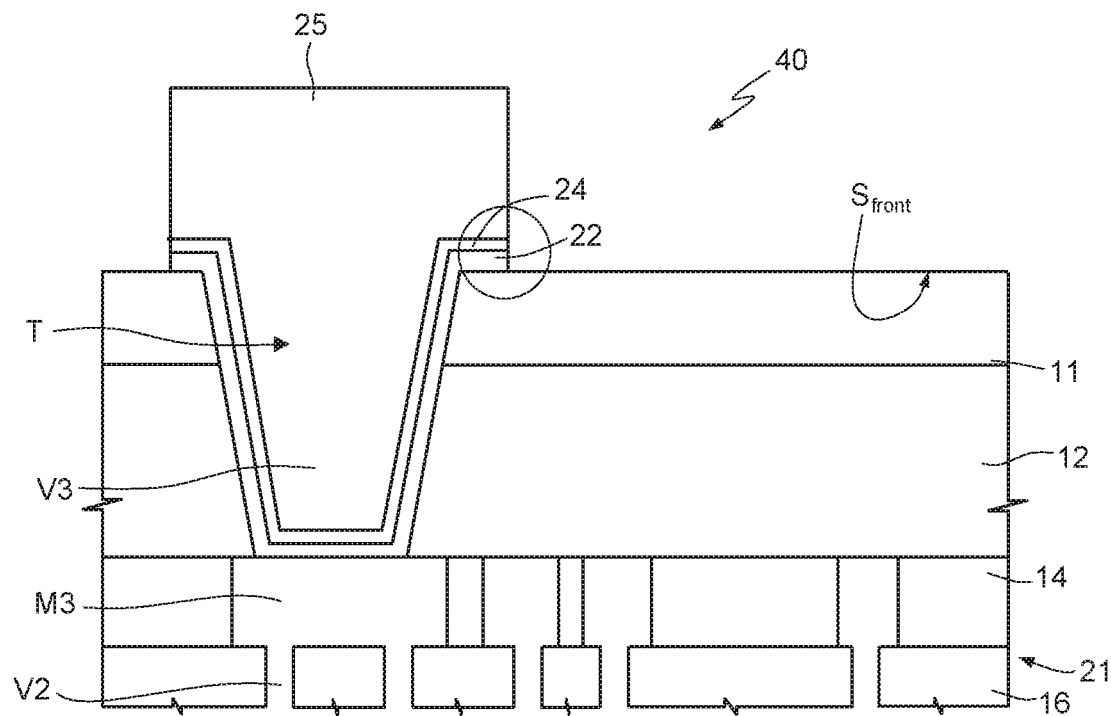
FIGS. 4A-4D show schematically transverse cross sections (not to scale) of portions of the integrated electronic device shown in FIG. 3, during successive steps of a fabrication process.
Figure 4B:
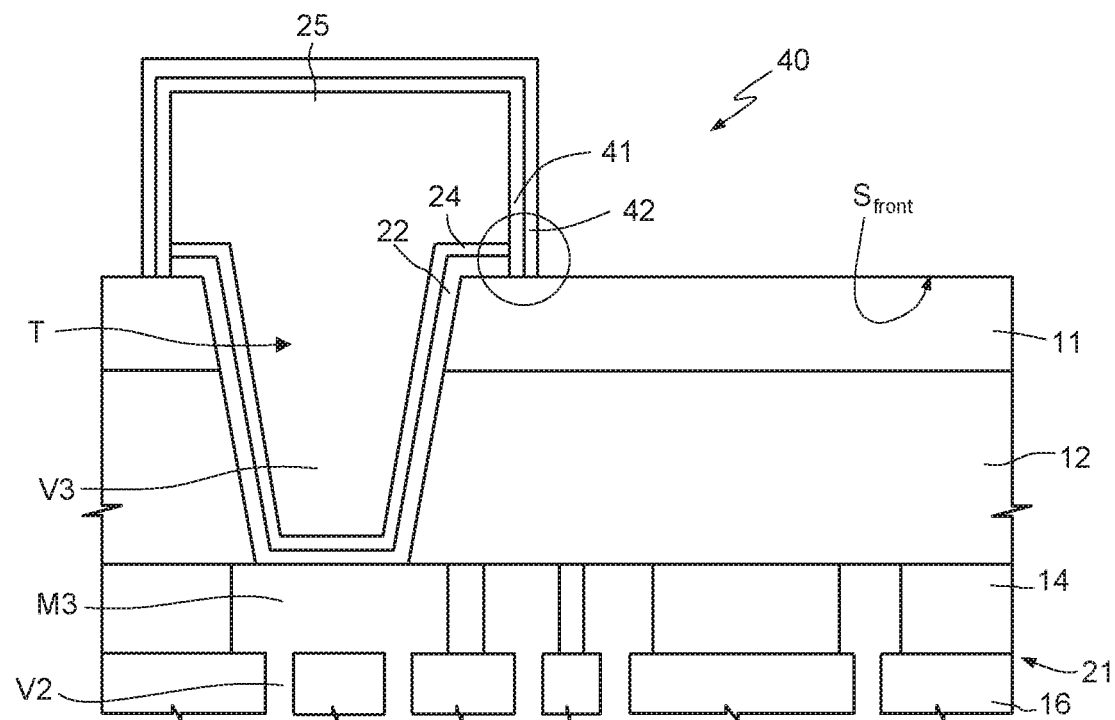

Once the structure has been obtained, as illustrated in FIGS. 2G and 4A, subsequently, as shown in FIG. 4B, the first coating layer 41 is formed, which layer entirely covers the exposed portions of the redistribution layer 25, of the patterned seed layer 24 and of the barrier layer 22. As previously stated, the first coating layer 41 may be formed from nickel, or else, again by way of example, from a nickel-phosphorous (NiP), nickel-phosphorous-tungsten (NiPW) or nickel-phosphorous-molybdenum (NiPMo) alloy.

For example, the first coating layer 41 is formed by means of deposition on the exposed metal surfaces.

The subsequent formation of the second coating layer 42 thus leads to what is shown in FIG. 4B. For example, the second coating layer 42 is formed by means of electroless deposition and selectively grows on the exposed surfaces of the first coating layer 41.

In this step of growing the first and the second coating layers 41, 42, the capillary openings 70 are spontaneously generated due to poor adhesion between the materials that constitute these layers and the materials that constitute the first dielectric layer 11.

Figure 4C:
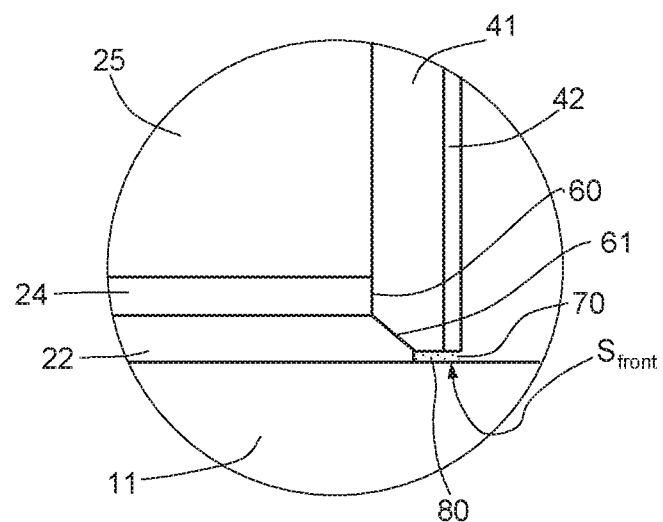

Subsequently, as illustrated in the detail in FIG. 4C, the first barrier layer 22 is brought into contact through the capillary openings 70 with an aqueous solution 80 for the selective dissolution of the barrier layer 22 at the location of the second contact region 61.

In more detail, the contact between the first barrier layer 22 and the aqueous solution 80 is possible by virtue of the presence of capillary openings 70 which allow the attraction through capillarity of the aqueous solution 80 towards the second contact region 61.

Figure 4D:
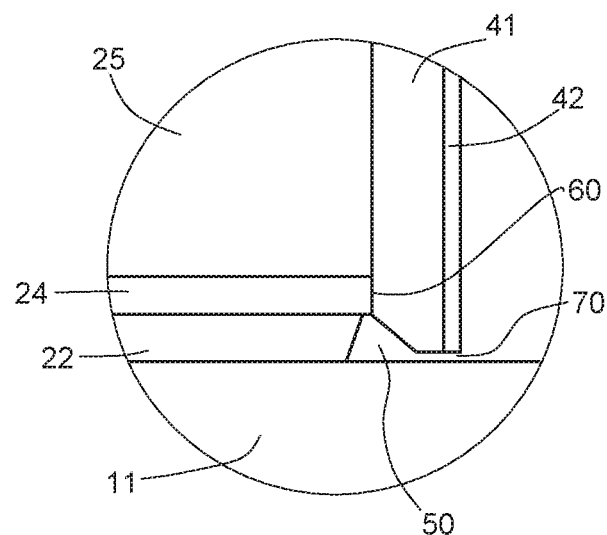

In this region, the aqueous solution 80 causes a dissolution of the barrier layer 22 at the location of the second contact region 61 without altering the structure of the first coating layer 41 and of the patterned seed layer 24 generating the cavity 50 (FIG. 4D).

The aqueous solution 80 comprises at least one oxidizing agent, in particular chosen from within the group composed of hydrogen peroxide, nitric acid and ozone.

The aqueous solution 80 may furthermore comprise an acid, in particular selected from within the group composed of nitric acid, hydrofluoric acid and hydrochloric acid.

Alternatively, the aqueous solution 80 may furthermore comprise a base, in particular selected from within the group composed of ammonium hydroxide, tetramethylammonium hydroxide and their derivates.

For example, the aqueous solution 80 may be a mixture chosen from within the group composed of $NH_4OH:H_2O_2:H_2O$, $TMAH:H_2O_2:H_2O$, $H_2O_2:H_2O$, $HF:H_2O_2:H_2O$ and $HNO_3:HF:H_2O$. The ratio between oxidant and acid or base may vary between 1:0.05 and 1:20. The aqueous solution 80 is such that it performs a selective wet etching on the barrier layer 22 in such a manner as to completely separate it from the first coating layer 41 and to form the cavity 50. This etch may take place by dissolution of the barrier layer 22 or oxidation and successive dissolution of the barrier layer 22. The dissolution of the barrier layer 22 is furthermore auto-limiting since the oxidant contained in the aqueous solution 80 tends to be subjected to decomposition reactions that generate gaseous oxygen. These decomposition reactions are catalyzed by the presence of copper, such as for example that from which the patterned seed layer 24 is formed. Therefore, it is hypothesized that, when the aqueous solution 80 encounters the patterned seed layer 24, the gaseous oxygen generated by the decomposition reaction of the aqueous solution impedes the further infiltration of fresh aqueous solution through the capillary openings 70.

The advantages that are offered by the present integrated electronic device are clearly apparent from the preceding description. In particular, the present integrated electronic device disposes of a frontal structure such that the passivation structure is subjected to lower mechanical stresses, compared with known devices.

Figure 5:
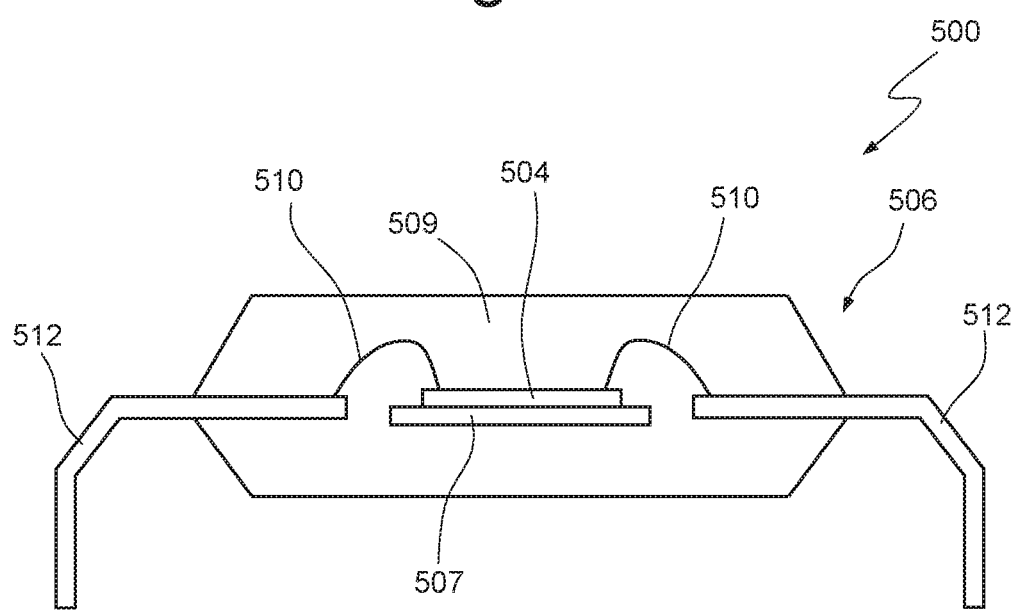
FIG. 5 shows schematically a transverse cross section of an integrated electronic circuit ("chip") that includes the present integrated electronic device.

As shown in FIG. 5, subsequent to the process of dicing of the die 4, the present integrated electronic device 40 may for example form a chip 500, which includes the individual die, indicated with 504, together with a lead frame 506. The chip 500 furthermore comprises an encapsulation or packaging region 509, which is formed for example by an epoxy resin, and one or more conducting wires 510.

In more detail, the lead frame 506 comprises a pad 507, on which the individual die 504 rests, and a plurality of terminals 512, each of which extends in part inside of the packaging region 509 and in part outside. Furthermore, the terminals 512 are electrically coupled to the individual die 504 through the conducting wires 510, which implement corresponding wire bondings and make contact with the redistribution layer 25/palladium layer (detail not visible in FIG. 5). The packaging region 509 surrounds the individual die 504, the pad 507 and the conducting wires 510.

Finally, it will be clear that modifications and variants may be applied to the present integrated electronic device and to the related fabrication process, without straying from the scope of the present disclosure.

For example, the passivation structure may be different compared with that described. Furthermore, the first and the second coating layers, the first barrier layer and, where present, the further barrier layers may have different thicknesses with respect to those described and may be formed from materials different from those described.

It is furthermore possible for the vias formed in a monolithic manner with the redistribution layer to be different from the distal vias. More generally, the level of the vias integrated with the redistribution layer is irrelevant. Even more generally, the same reference to RDL technology, intended as characteristic thicknesses and materials, is irrelevant for the purposes of the present integrated electronic device.

There are furthermore possible embodiments in which a further metal layer, formed for example from gold, extends over the second coating layer.

With regard to the fabrication process, some of the steps described may be carried out in a different order with respect to that described. Furthermore, it is possible for the fabrication process to include steps not described hereinabove.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a hole through a frontal surface of a frontal dielectric layer;
    forming a plurality of vias aligned with the hole through a plurality of dielectric layers;
    forming a first barrier layer in the hole, on the plurality of vias, and on the frontal surface, the first barrier layer including sides on the frontal surface and transverse to the frontal surface;
    forming a redistribution layer on the first barrier layer, the redistribution layer including a first portion in the hole through the frontal dielectric layer and a second portion on the first portion having a plurality of sides;
    forming a first coating layer on the first portion of the redistribution layer and on the sides of the first portion of the redistribution layer;
    forming a second coating layer covering the first coating layer;
    forming a capillary opening that extends from the first coating layer and the second coating layer to the frontal surface of the frontal dielectric layer; and
    forming a cavity by bringing into contact by capillarity an aqueous solution with the first barrier region through the capillary opening to selectively remove a portion of the barrier region to separate and space apart the barrier region from the first coating layer.

2. The method of claim 1, wherein the aqueous solution comprises a solution including at least one oxidizing agent.

3. The method of claim 2, wherein the oxidizing agent is selected from at least one of hydrogen peroxide, nitric acid, and ozone.

4. The method of claim 2, wherein the aqueous solution comprises an acid.

5. The method of claim 4, wherein the acid is selected from at least one of nitric acid, hydrofluoric acid, and hydrochloric acid.

6. The method of claim 2, wherein the aqueous solution comprises a base.

7. The method of claim 6, wherein the base is selected from at least one of ammonium hydroxide, tetramethylammonium hydroxide, and their derivates.

8. The method of claim 1, wherein the aqueous solution is a mixture selected from $NH_4OH:H_2O_2:H_2O$, $TMAH:H_2O_2:H_2O$, $H_2O_2:H_2O$, $HF:H_2O_2:H_2O$ and $HNO_3:HF:H_2O$.

9. The method of claim 8, wherein the ratio between oxidant and acid or base ranges from 1:0.05 to 1:20.

10. The method of claim 1, wherein the barrier region is formed from a material selected from at least one of Ti, Ta, TiN, TiW, TaNTa.

11. A method, comprising:
    forming a recess extending into a surface of a first dielectric layer of a die;
    forming a barrier layer in the recess and on the surface of the first dielectric layer of the die, a first sidewall of the barrier layer being on the surface of the first dielectric layer of the die and transverse to the surface of the first dielectric layer of the die;
    forming a seed layer in the recess and on the barrier layer aligning a second sidewall of the seed layer with the first sidewall of the barrier layer, the second sidewall of the seed layer being transverse to the surface of the first dielectric layer of the die;
    forming a redistribution layer in the recess and on the seed layer, a third sidewall of the redistribution layer being aligned with the first sidewall of the barrier layer and aligned with the second sidewall of the seed layer;
    forming a first coating layer on the third sidewall of the redistribution layer, the second sidewall of the seed layer, and the first sidewall of the barrier layer;
    forming a second coating layer on the first coating layer;
    forming a capillary opening extending from the second coating layer to the surface of the first dielectric layer of the die; and
    forming a cavity between the first barrier layer and the first coating layer by passing an aqueous solution through the capillary opening by capillarity, the cavity separating the barrier layer from the first coating layer.

12. The method of claim 11, further comprising:
    forming the capillary opening extending between the first coating layer to the surface of the first dielectric layer of the die.

13. The method of claim 11, wherein forming the cavity further comprises:
    forming a first lateral surface of the barrier layer laterally adjacent to the cavity;
    exposing a second lateral surface of the first coating layer laterally adjacent to the cavity and separated from the first lateral surface of the barrier layer;
    exposing a third surface of seed layer extending from the first lateral surface to the second lateral surface; and
    exposing a portion of the surface of the first dielectric layer of the die covered by the barrier layer.

14. The method of claim 11, wherein forming the recess extending into the surface of the first dielectric layer of the die further comprises forming the recess extending through the first dielectric layer of the die and extending into a second dielectric layer of the die.

15. The method of claim 11, wherein forming the redistribution layer further comprises:
    forming a resist mask layer with an opening on the surface of the dielectric layer of the die and aligning the opening with the recess in the surface of the dielectric layer of the die;
    forming the redistribution layer in the recess and in the opening; and
    removing the resist mask layer.

16. A method, comprising:
    forming a first coating layer covering a first sidewall of a redistribution layer, covering a second sidewall of a barrier layer aligned with the first sidewall, covering a third sidewall of a seed layer aligned with the first sidewall, and on a surface of a dielectric layer of a die transverse to the first sidewall, the second sidewall, and the third sidewall;
    forming a capillary opening between the first coating layer and the surface of the dielectric layer of the die, the capillary opening separating the first coating layer from the die; and
    removing a portion of the barrier layer forming a cavity separating the barrier layer from the first coating layer by exposing the portion of the barrier layer to an aqueous solution through the capillary opening.

17. The method of claim 16, wherein forming the capillary opening in the first coating layer further comprises selecting a material for the first coating layer having poor adhesion to the surface of the dielectric layer of the die.

18. The method of claim 16, further comprising:
forming a second coating layer on the first coating layer; and
forming the capillary opening between the second coating layer and the surface of the dielectric layer of the die separating the second coating layer form the die.

19. The method of claim 18, wherein forming the capillary opening in the second coating layer further comprises selecting a material for the second coating layer having poor adhesion to the surface of the dielectric layer of the die.

20. The method of claim 16, further comprising:
forming a recess extending into the surface of the dielectric layer of the die;
forming the barrier layer in the recess and on the surface the dielectric layer of the die;
forming the seed layer on the barrier layer; and
forming the redistribution layer in the recess and on the seed layer.

\* \* \* \* \*

UNITED STATES PATENT AND TRADEMARK OFFICE
CERTIFICATE OF CORRECTION

Page 1 of 1

PATENT NO. : 11,587,866 B2
APPLICATION NO. : 17/000165
DATED : February 21, 2023
INVENTOR(S) : Francesco Maria Pipia et al.

It is certified that error appears in the above-identified patent and that said Letters Patent is hereby corrected as shown below:

On the Title Page

<u>ITEM (57) ABSTRACT, Column 2, Line 9:</u>
"second coating layer covers is formed covering" should read: --second coating layer is formed covering--.

Signed and Sealed this
Twenty-fifth Day of April, 2023

Katherine Kelly Vidal
*Director of the United States Patent and Trademark Office*